United States Patent [19]

Verheesen et al.

[11] Patent Number: 5,147,762
[45] Date of Patent: Sep. 15, 1992

[54] PROCESS FOR PREPARING A ROTARY SILK-SCREEN PRINTING STENCIL FOR PRINTING

[75] Inventors: Wilhelmus J. F. Verheesen, Zwartven; Arnoldus T. Steenkamer, Oostrum, both of Netherlands

[73] Assignee: Stork X-Cel B.V., Netherlands

[21] Appl. No.: 332,750

[22] Filed: Apr. 3, 1989

[30] Foreign Application Priority Data

Apr. 16, 1988 [NL] Netherlands .................. 8800991
May 9, 1988 [NL] Netherlands .................. 8801218

[51] Int. Cl.$^5$ .................................. G03F 7/12
[52] U.S. Cl. .................................. 430/308; 430/300; 101/128.4
[58] Field of Search .................. 430/300, 308; 101/128.4

[56] References Cited

U.S. PATENT DOCUMENTS 3,454,399  7/1969  Edwards .................. 430/308

Primary Examiner—Richard L. Schilling
Assistant Examiner—Janis L. Dote
Attorney, Agent, or Firm—Gunn, Lee & Miller

[57] ABSTRACT

Disclosed is a process for preparing a cylindrical rotary screen printing stencil to made it suitable for use in a screen printing machine.

In the process the steps of application of a photosensitive coating, drying, pattern-wise exposure, development and hardening are carried out while the end rings are already fitted in the ends of the screen.

Described is also a system of devices suitable for carrying out said process.

6 Claims, 6 Drawing Sheets

FIG:2.

PROCESS FOR PREPARING A ROTARY SILK-SCREEN PRINTING STENCIL FOR PRINTING

BACKGROUND OF THE INVENTION

The invention relates in the first place to a process for preparing a cylindrical rotary silk-screen printing stencil for printing, comprising the steps of applying a patterned sealing coating to the stencil and fixing end rings in the stencil in order to be able to incorporate it in a printing machine.

Such a process is generally used in the industry involved in printing materials using rotary silk-screen printing.

A rotary silk-screen printing stencil is a cylindrical metal sleeve, often made of nickel, which is provided with a large number of regularly arranged perforations. The part of such a stencil corresponding to those areas of the substrate which have to remain unprinted is sealed, while in the remaining surface of the stencil the perforations remain un-sealed. A stencil which is not provided with a patterned seal is also often called a screen, while a stencil is then the term used for a screen provided with a patterned seal. In the present invention no distinction will be made and, depending on the situation, a stencil can represent either an unsealed screen or a screen sealed in a pattern. Such a stencil with a seal in pattern form is clamped using end rings in a rotary silk-screen printing machine and subsequently, using a suitable squeegee inside the stencil, an impression of the open part of the stencil can be applied continuously to a substrate which moves in contact with the stencil at a uniform speed which is equal to the peripheral speed of the stencil in question.

In general, the stencil is first provided with the above-mentioned patterned seal, and only then are the end rings placed in the stencil.

Nowadays there is an increasing need for an accelerated process in which the patterned sealing coating on a stencil is replaced by a different patterned sealing coating.

This need for pattern changing speed has to do with the short print lengths desired for certain types of printed matter. For example, in label printing only a few thousand meters of a particular type of label will often be required; the time taken for such a print length is short, and the facility for a rapid change of pattern using a limited stock of stencils is therefore very desirable.

In such a case a stencil hitherto first had its end rings removed; the stencil was then stripped and a new patterned sealing coating was applied to the stencil again.

Such a process is very time-consuming, particularly in view of the fact that for good fixing of end rings in a stencil adhesives requiring a relatively long hardening time are used.

The object of the present invention is to produce a solution to the above-mentioned disadvantage, and to this end the invention is characterized in that in the process of the type mentioned, starting from an uncoated stencil, the end rings are first fixed and the patterned sealing coating is then formed by coating the stencil with a layer of a photographic lacquer, drying and patterned exposure thereof, and developing and hardening of the patterned sealing coating.

A very considerable saving of time is achieved by providing the stencil with end rings once, at the beginning of its service life, and leaving these end rings in the stencil during all subsequent operations, which makes a quick pattern change possible.

Use of the process according to the invention also means that the stability of the stencils during their use is improved very considerably. For the end rings give the relatively delicate stencil improved resistance to deformation, which means that damage is much less likely to occur. Since the rings stay in the stencil all the time once fitted, the total service life of the stencils is also very greatly improved.

In particular, the process according to the invention is carried out such that end rings whose greatest external diameter is smaller than the external diameter of the stencil in question are used, and for the application of the coat of photographic lacquer the stencil is accommodated between two supporting rings, which can each accommodate an end ring at one end on the inside, and in which at least at said end the external diameter is essentially equal to the external diameter of the stencil in question, and during the coating one or more coats of a liquid photographic lacquer are applied to the outside of the stencil, possibly with intermediate drying, and using a sealing collar lying against the stencil. Preferably a supporting ring which is identical at both ends and has the same external diameter over its entire length is used.

Using in particular end rings which, during the operation in which a coat of liquid photographic lacquer is being applied to the outside of the stencil, fall within the supporting rings used in that coating operation means that the so-called designing process can be carried out in all cases with a stencil already containing the end rings.

The invention also relates to a system of devices for making ready for printing a rotary silk-screen printing stencil, with which a stencil is provided with a patterned, hardened coating and end rings are fitted in order to permit placing of the stencil in a printing machine.

Such a system of devices will in general be found in a department for designing rotary silk-screen printing stencils.

According to the invention such a system is made up of one or more of the following devices: a coating device for applying a photographic lacquer coating to the stencil, an exposure device for patterned exposure of the photographic lacquer coating, a developing device for developing the coating exposed in pattern form, a hardening device for thermal hardening of the patterned coating present after developing; if necessary, a stripping device for stripping a patterned coating which may or may not be thermally hardened, and an adhesive application device for providing the stencil with end rings; the devices indicated and forming part of the system are designed in such a way that in a first adhesive application device the stencil can be provided with end rings, and each of the remaining devices of the system is designed in such a way that the stencil can be accommodated and processed together with the end rings which have been fitted.

If in such a system of devices in particular the device with which a photographic lacquer coat is applied to the outside of a stencil is designed in such a way that it can function in the presence of end rings in the stencil in question, this makes it possible to achieve a very rapid change of a patterned sealing coating on a stencil in such a system.

In such a system it is not important now whether it is a brand new stencil or a used stencil, or a stencil which has been previously subjected to a stripping operation to remove a patterned sealing coating applied earlier.

The specific aspects of the devices forming part of the system are indicated in the sub-claims and will be explained in greater detail in the discussion of the drawing below.

BRIEF DESCRIPTION OF THE DRAWINGS

The figures in the drawing show the following:

In FIG. 1 a device for applying adhesive to end rings is indicated by reference number 10; a stencil is indicated by 12, while 17 indicates one of the two end rings to be fixed in the stencil. The stencil is generally a metal stencil such as a nickel stencil which has a thickness of 100-200 um, a circumference of 64 cm and an axial length of up to 1 m, although the length may be smaller or greater than that.

Figure 1:
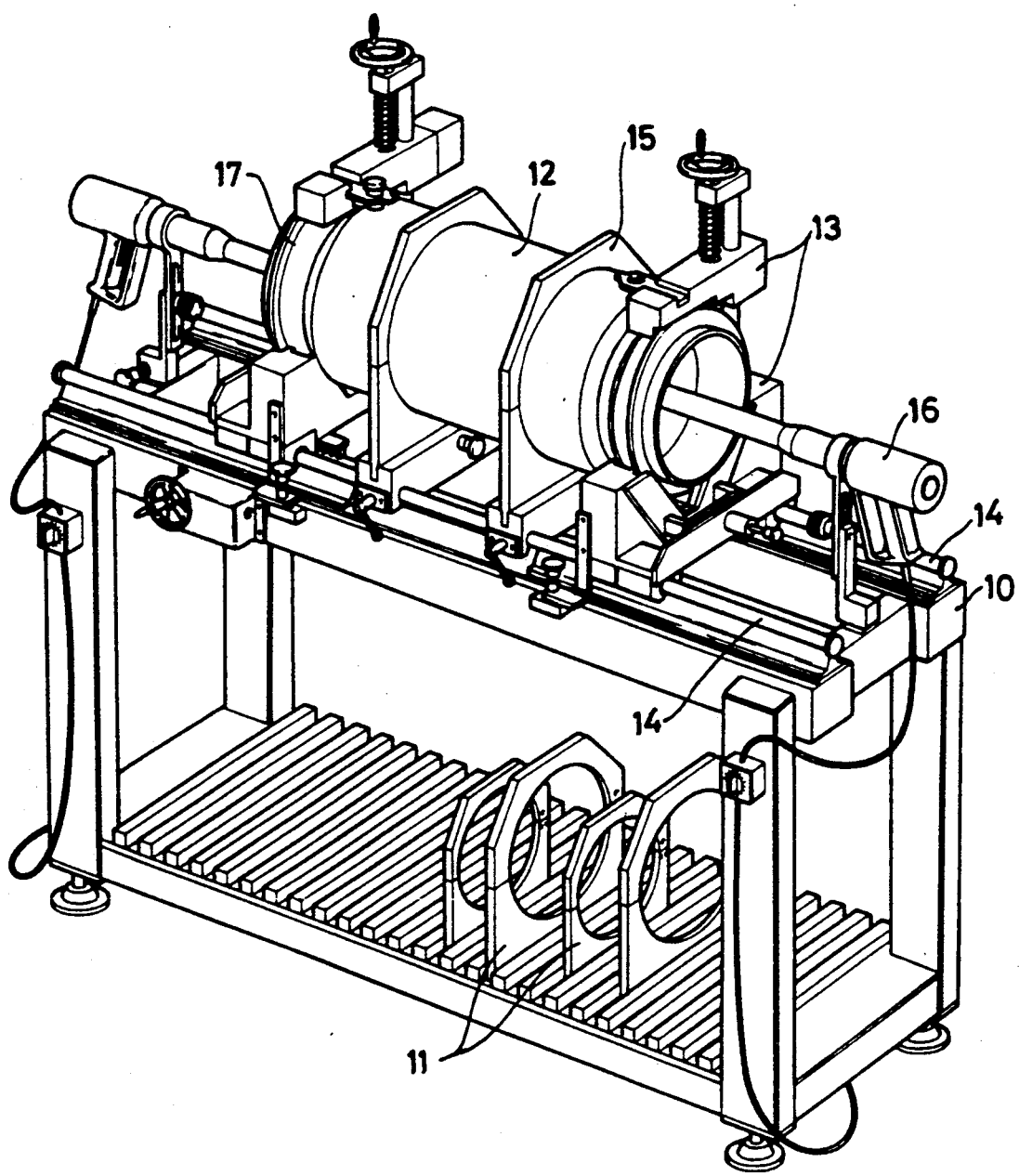
FIG. 1 shows a device for fitting end rings in a stencil.

The stencil 12 is confined in holders 15 which ensure a good cylindrical shape of the stencil, while the end rings to be fixed are accommodated in holders 13. When a stencil 12 is fitted in the correct position the holders 13 containing the end rings, which are provided with adhesive, are moved along the guides 14 until the ends of the end rings smeared with adhesive fit tightly within the periphery of the stencil 12. The end rings are expediently provided with a buffer edge which is a height above the end ring which is essentially equal to the thickness of the stencil material in question. The adhesive used is generally a mixture of a hardenable plastic and a hardener, for example an epoxy resin and an amine hardener.

In the event of a more rapid hardening being desired, use can be made of the hot air guns 16, which by means of a suitable nozzle ensure heating of the inside of the end ring.

Reference number 11 indicates a number of stencil holders which can serve for stencils of a different repeat of pattern. The end ring holders 13 are of a universal type with which a large number of different end rings can be handled, and in which the end rings and the holder form a three-point contact with each other.

Figure 2:
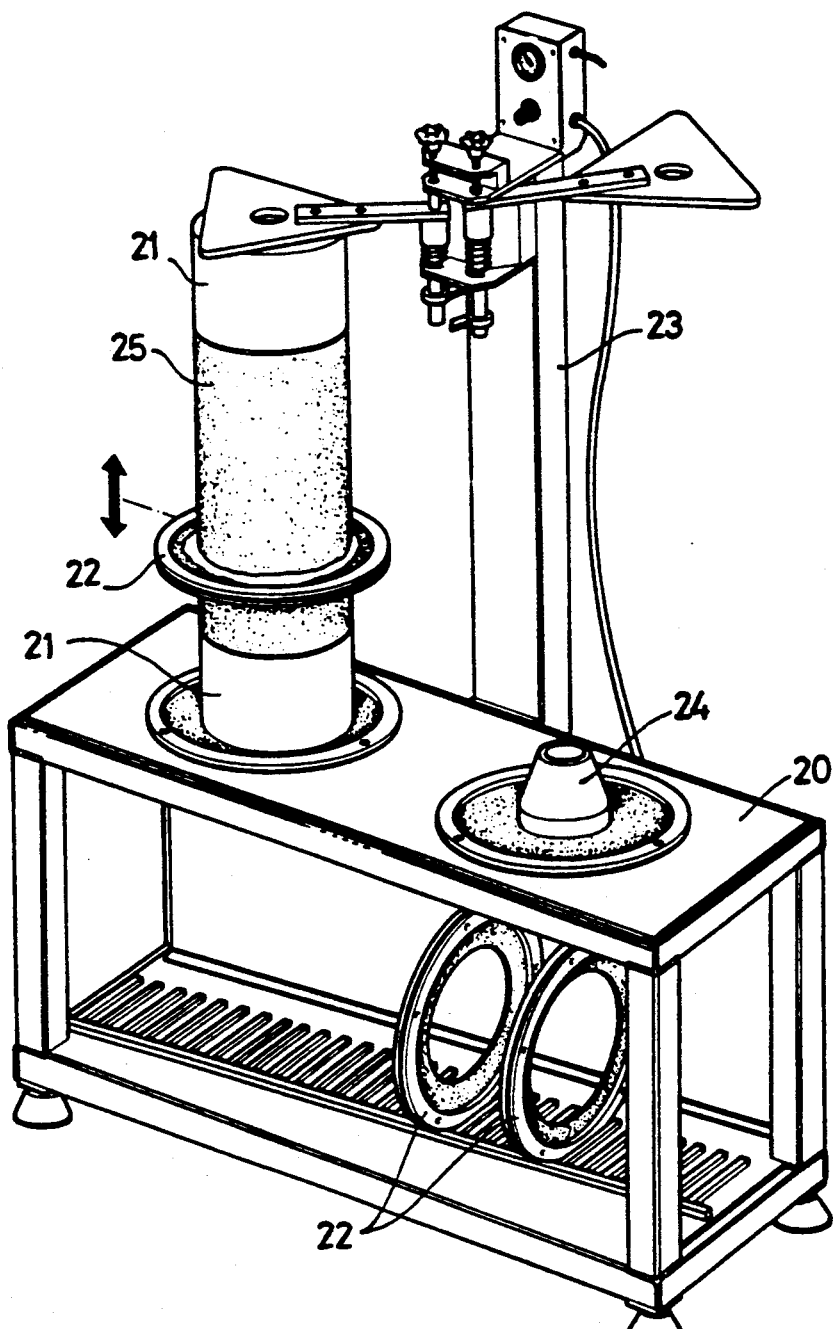
FIG. 2 shows schematically a device for applying a photographic lacquer coating to the outside of a stencil.

FIG. 2 shows schematically a stencil coating device in which it can be seen that a stencil 25 is fitted between two supporting rings 21, which in this case are fixed in the stencil in the device 10 described above. The assembly of supporting rings 21 and stencil 25 is held in place by means of a retaining device 23. An annular sealing collar 22 which lies round the stencil and can be filled with photographic emulsion, which in this case is brushed off on the external surface of the stencil by moving the collar upwards, is used to apply a coating.

The photographic emulsion coating can, if desired, be made up of several separately applied coats, each coat being dried following its application. After application of the first coat and drying thereof, an air bag may already be inserted in the stencil if desired, and can subsequently also serve to stabilize the cylinder shape of the stencil in the exposure operation.

Of course, it is also possible to use a so-called immersion coating device of Applicants, in which a container with liquid photographic lacquer is moved downwards along the stencil, and in which there is also a sealing collar resting against the outside of the stencil.

Reference number 24 in FIG. 2 shows that the supporting ring 21 used and the end ring of the stencil accommodated by the supporting ring 21 are centered relative to the device 20.

Figure 3:
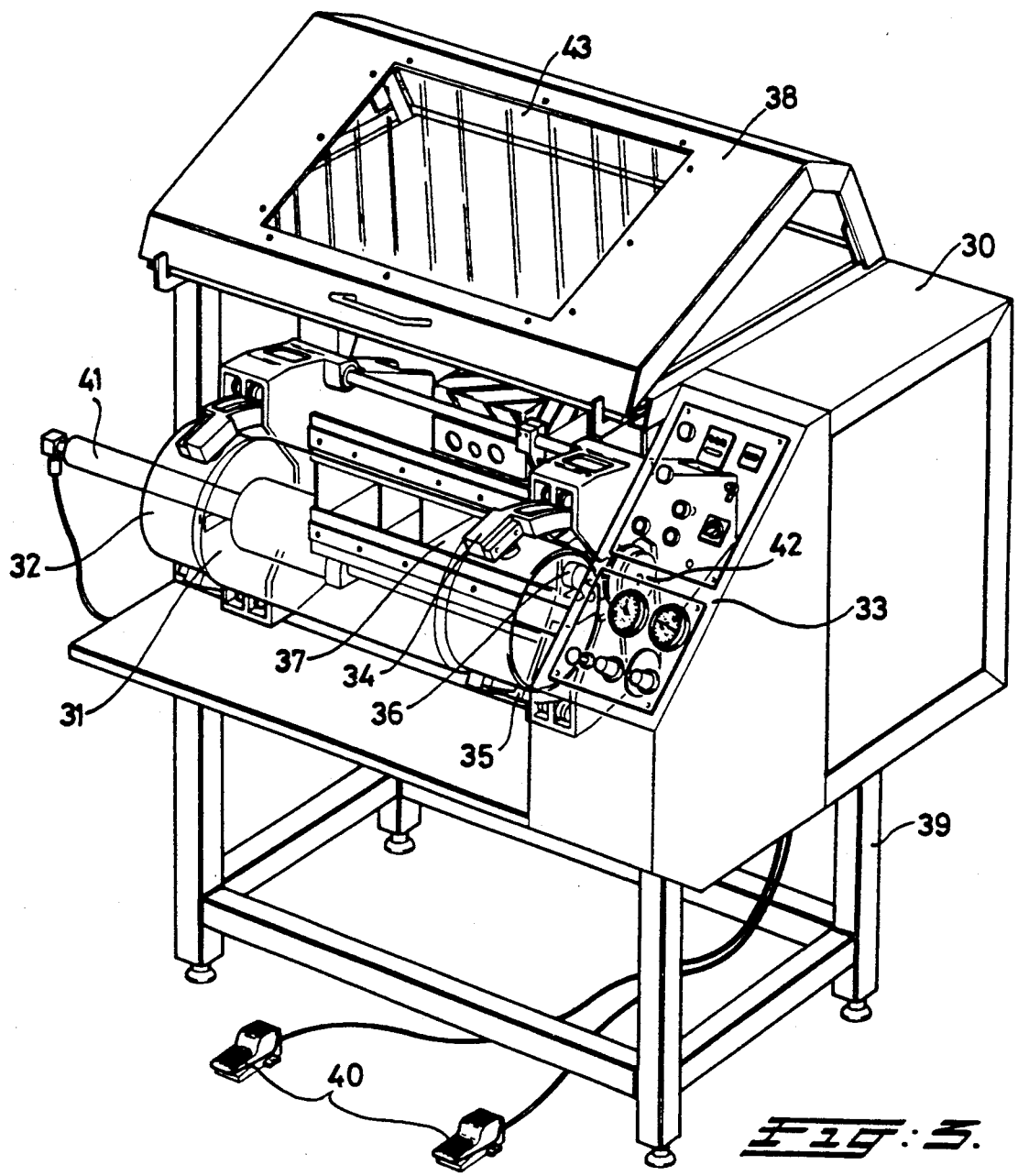
FIG. 3 shows a device for patterned exposure of a photographic lacquer coating on the outside of a stencil.

FIG. 3 shows a device for patterned exposure of a stencil which is provided on the outside with a dried coat of photographic lacquer. A stencil 31, provided with end rings 32, is accommodated by arms 34 and 35 and a stop 36. The arms and the stop have roller bearings, permitting the stencil and the end rings to rotate relative to said arms. The stencil is driven by means of a toothing (not shown) which is present on the end ring and which can mate with a driven gear 42. The stop 36 is arranged in such a way that the outside of an accommodated stencil is always placed at a constant distance from the exposure window 37. The exposure time can be set by means of the control panel 33 in such a way that for each type of stencil a unit of area of said stencil receives the same amount of light energy. Reference number 40 indicates pedals which can serve to operate the device when the operator has both hands occupied in the device.

Reference number 41 is the shaft of an inflatable elastomer bag which is present inside the stencil 31 during the exposure process and which is used to produce a stable cylinder shape for the external surface of the stencil during the clamping of a pattern film on the outside of the stencil and during the rotation of the stencil. The rubber bag, which is not shown here, is filled through the inside of the shaft with a pressurized medium such as, for example, air.

Reference numbers 38 and 43 show a protective hood and a window respectively, serving to protect the operator during the exposure against the effect of ultraviolet radiation, since many photographic lacquers harden only if radiation with a wavelength between 350 and 500 nanometres is used. It is expedient for the light slit to be protected during the preparation for exposure by a protective strip which is pushed away at the commencement of the exposure.

In respect of the foregoing it is to be noted that it is not necessary to use an exposure device as discussed hereinbefore.

In the system of devices also a more simple device may be included such as one having a housing which is able to accommodate a screen which is supported by an inflatable bag on an axis as indicated before. Symmetrically around the periphery of the screen a plurality of UV-tubes of elongated form is disposed, the axis of which tubes extend in axial direction of the housing and parallel to the screen axis. Upon use a patterning film is pressed to the surface of the screen on which a photosensitive lacquer coating has been applied before.

The UV-tubes are activated and the screen is rotated until the desired degree of photo hardening has been reached.

Figure 4:
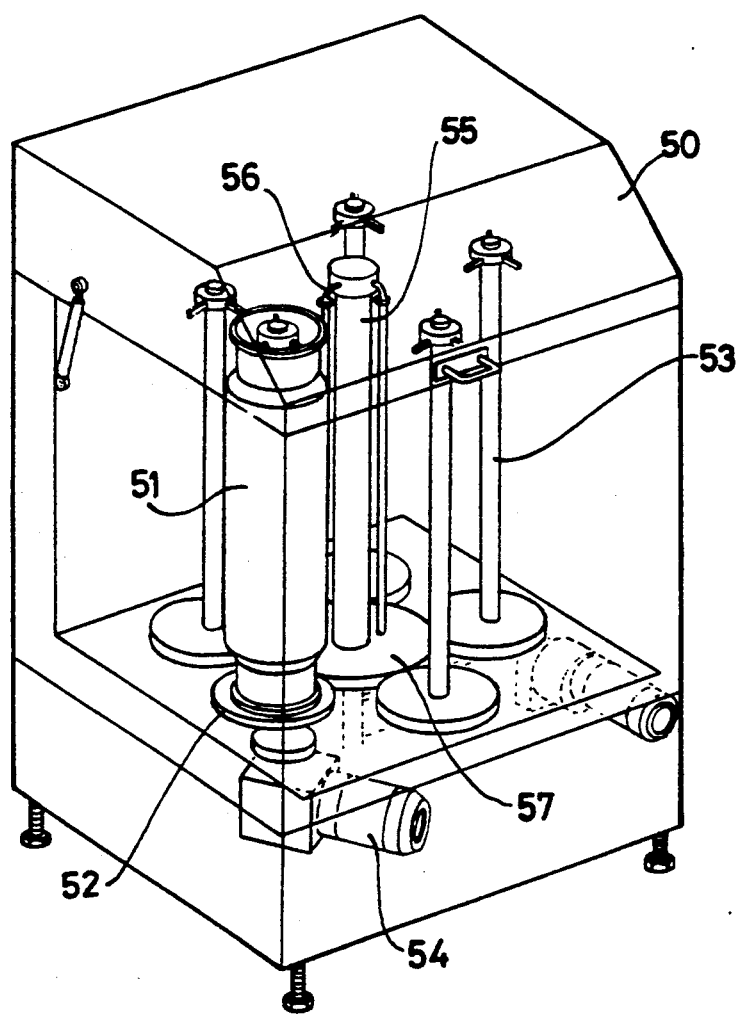
FIG. 4 shows a device for developing a photographic coating exposed in pattern form.

FIG. 4 shows a developing unit which in this case can accommodate five stencils, which can be developed simultaneously. The stencils are accommodated on a rotary developing fluid distributing device 53, by means of which developing fluid is fed to the inside of a stencil 51. Developing fluid is also fed to the outside of the stencil by distributing device 55, which is provided with spray elements 56. During the developing process, devices 52, 54 and 57 ensure rotation of the stencils accommodated in the unit and of the developing fluid distributing devices therein. The unit is expediently accommodated, as shown, in a liquid-tight housing.

Figure 5:
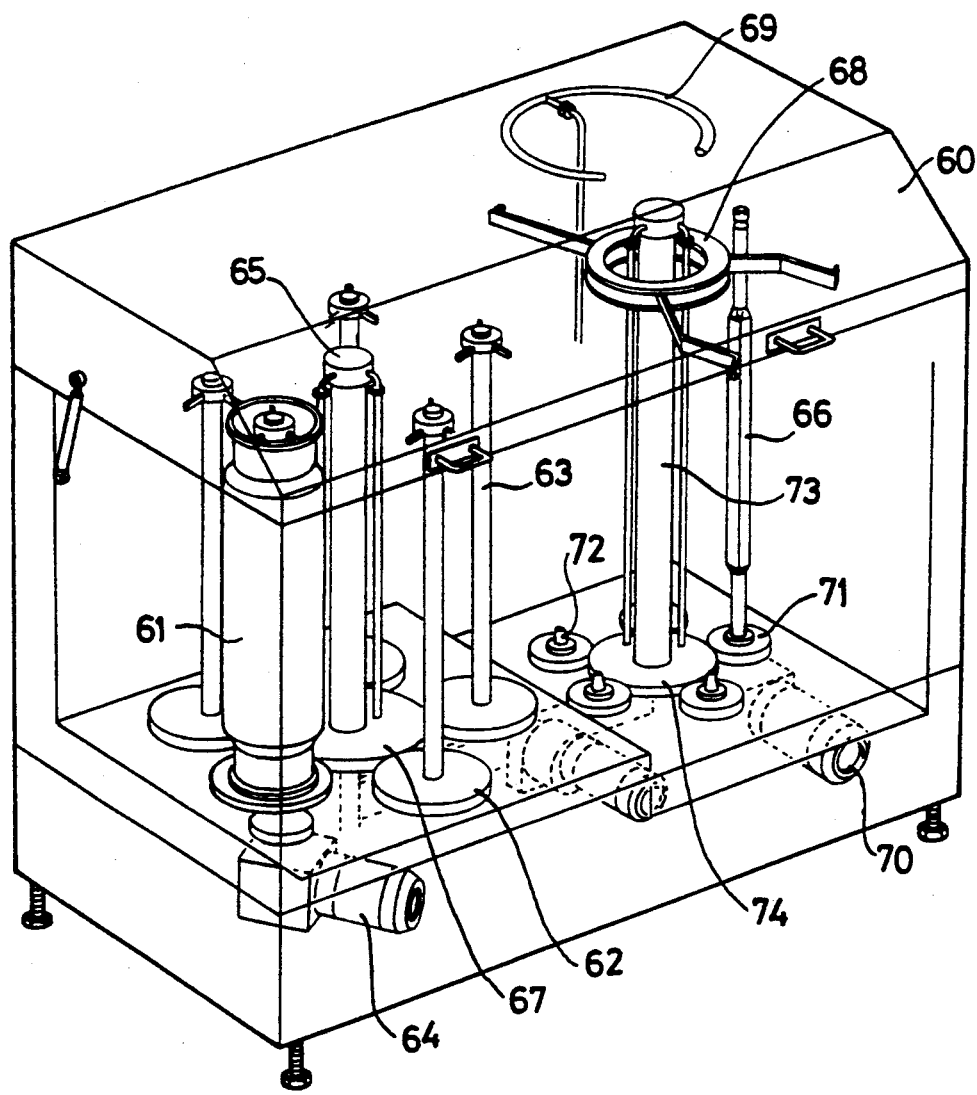
FIG. 5 shows a device for washing stencils and squeegees following their use in a printing machine.

FIG. 5 shows a combined device for washing one or more stencils and washing one or more squeegees used during the printing process. As can be seen, the stencil washing device is very similar to the stencil developing device outlined above and need not be described in greater detail. The squeegee washing device is based on a principle comparable to that of the stencil washing device, except that in this case the washing fluid used is supplied from the bottom end through the centre of the squeegee, while means are also present to spray the outside of a number of squeegees present with a strong jet of washing medium. The means for spraying the squeegees on the outside are formed by the spraying means 68 and 69 shown. During the cleaning of the squeegees also, the squeegees are preferably rotated by means of rotation means 70, 71 and 74.

Figure 6:
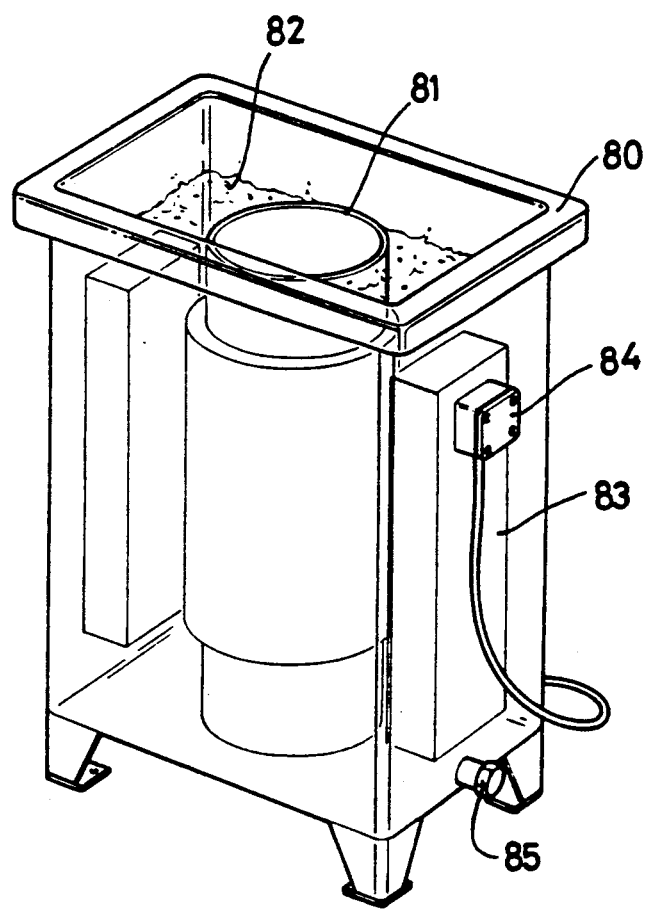
FIG. 6 shows a device for stripping off a patterned sealing coating from a stencil.

FIG. 6 shows a stripping device 80 for removing a patterned sealing coat from a stencil. Such a coat may or may not be thermally hardened; during the stripping operation the end rings remain in the stencil. Through suitable selection of a stripping agent, it can be ensured that the adhesive used for fixing the end rings is not adversely affected. The stripping device advantageously contains elements 83, 84 for supplying ultrasonic energy to the stripping fluid 82 present in the device. Reference number 85 indicates a drainage point by means of which soiling stripping fluid can be removed from the device 80.

In the foregoing a photographic lacquer means to indicate a photosensitive composition, often also called a photolacquer which either hardens or decomposes under influence of high energy radiation such as UV-radiation.

Upon patternwise exposure of a lacquer layer the exposed parts of the pattern either become insoluble in a solvent such as water (negative resists) or soluble in a developer such as a weakly alkaline solution (positive resists).

What is claimed is:

1. Process for preparing a cylindrical rotary silk-screen printing stencil for printing comprising the steps of:
   first affixing an end ring to the inside of each end of an uncoated cylindrical stencil;
   forming a patterned sealing coating on said uncoated stencil comprising the steps of:
   coating said uncoated stencil with a layer of photographic lacquer;
   drying said layer;
   exposing said layer to light in a pattern;
   developing said exposed layer; and
   hardening said developed layer.

2. The process of claim 1 further comprising the steps of:
   removing said patterned sealing coating from said stencil; and
   forming a second patterned sealing coating on said stencil, each of said end rings remaining affixed to said stencil during said removing and said second patterned sealing coating steps.

3. The process of claim 1 wherein the greatest external diameter of said end rings is smaller than the external diameter of said stencil, and further comprising the steps of:
   supporting said uncoated stencil during said coating step between two supporting rings each having two ends, each of said supporting rings accommodating inside of a first end thereof one of said end rings, said first end of each of said end rings, said first end of each of said supporting rings having an external diameter essentially equal to said external diameter of said stencil; and
   applying said layer of photographic lacquer in one or more coats by the movement of a sealing collar mounted around said stencil, said collar filled with said photographic lacquer.

4. The process of claim 2 wherein the greatest external diameter of said end rings is smaller than the external diameter of said stencil, and further comprising the steps of:
   supporting said uncoated stencil during said coating step between two supporting rings each having two ends, each of said supporting rings accommodating inside of a first end thereof one of said end rings, said first end of each of said supporting rings having an external diameter essentially equal to said external diameter of said stencil; and
   applying said layer of photographic lacquer in one or more coats by the movement of a sealing collar mounted around said stencil, said collar filled with said photographic lacquer.

5. The process of claim 3 wherein a second end of each of said supporting rings has the same external diameter as said first end, each of said supporting rings having an equal external diameter along its entire length.

6. The process of claim 4 wherein a second end of each of said supporting rings has the same external diameter as said first end, each of said supporting rings having an equal external diameter along its entire length.

* * * * *